United States Patent
Peake et al.

(10) Patent No.: US 6,660,591 B2
(45) Date of Patent: Dec. 9, 2003

(54) TRENCH-GATE SEMICONDUCTOR DEVICES HAVING A CHANNEL-ACCOMMODATING REGION AND THEIR METHODS OF MANUFACTURE

(75) Inventors: Steven T. Peake, Warrington (GB); Georgios Petkos, Stockport (GB); Robert J. Farr, Halifax (GB); Christopher M. Rogers, Manchester (GB); Raymond J. Grover, Didsbury (GB); Peter J. Forbes, Manchester (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/134,209

(22) Filed: Apr. 26, 2002

(65) Prior Publication Data

US 2002/0160557 A1 Oct. 31, 2002

(30) Foreign Application Priority Data

Apr. 28, 2001 (GB) .............................................. 0110458
Dec. 14, 2001 (GB) .............................................. 0129890

(51) Int. Cl.$^7$ ............................................ H01L 21/336
(52) U.S. Cl. ....................................................... 438/270
(58) Field of Search ................................ 438/270, 272

(56) References Cited

U.S. PATENT DOCUMENTS

| | | | |
|---|---|---|---|
| 5,527,720 A | 6/1996 | Goodyear et al. | 437/29 |
| 5,877,055 A * | 3/1999 | Wen | 438/276 |
| 6,087,224 A | 7/2000 | Luo | 438/270 |
| 6,121,089 A | 9/2000 | Zeng et al. | 438/268 |
| 6,211,018 B1 | 4/2001 | Nam et al. | 438/270 |
| 6,228,698 B1 * | 5/2001 | Luo | 438/234 |
| 2001/0038121 A1 * | 11/2001 | Kim et al. | 257/330 |

* cited by examiner

Primary Examiner—Wael Fahmy
Assistant Examiner—Howard Weiss
(74) Attorney, Agent, or Firm—Steven R. Biren

(57) ABSTRACT

Compact trench-gate semiconductor devices, for example a cellular power MOSFET with sub-micron pitch (Yc), are manufactured with self-aligned techniques that use sidewall spacers (52) in different ways. Thereby, the source region (13) and a contact window (18a) for a source electrode (33) can be self-aligned to a narrow trench (20) containing the trench-gate (11). Thereby, the channel-accommodating region (15) can also be provided after forming the trench-gate (11), and with very good control of its doping concentration (Na; p) adjacent to the trench (20). To achieve this control, its dopant is provided after removing the spacers (52) from the mask (51) so as to form a doping window (51b), which may also be used for the source dopant, adjacent to the trench-gate (11). A high energy dopant implant (61) or other doping process provides this channel dopant adjacent to the trench (20) and extending laterally below the mask (51,51n). A remarkably uniform doping profile can be achieved beneath the doping window (51b) and beneath the mask (51,51n). By using a high ion energy and high dose, the dopant ions (61) at the doping window (51b) can be laterally scattered below the mask (51) while those at the mask (51) penetrate there-through to be implanted in the underlying portion of the body (100).

24 Claims, 10 Drawing Sheets

TRENCH-GATE SEMICONDUCTOR DEVICES HAVING A CHANNEL-ACCOMMODATING REGION AND THEIR METHODS OF MANUFACTURE

FIELD OF THE INVENTION

This invention relates to trench-gate semiconductor devices, for example power MOSFETs (insulated-gate field-effect transistors), and to their manufacture using self-aligned techniques to fabricate the devices with compact geometries.

BACKGROUND AND SUMMARY OF THE INVENTION

Trench-gate semiconductor devices are known, having a trench-gate in a trench that extends from a source region of a first conductivity type through a channel-accommodating region of a second conductivity type to a drain region of the first conductivity type. United States patent specification U.S. Pat. No. 6,087,224 (our reference PHB34245) discloses an advantageous method of manufacturing such trench-gate semiconductor devices, wherein:

(a) a narrow window is defined by providing sidewall extensions at the sidewalls of a wider window in a first mask at a surface of a semiconductor body, (b) a trench is etched into the body at the narrow window, and the gate is provided in the trench, and (c) the source region is provided so as to be self-aligned with the trench-gate by means of the sidewall extensions.

This method permits the use of self-aligned masking techniques in a flexible device process with good reproducibility. In particular, by using the sidewall extensions in different stages, narrow trench-gates can be formed and the source region and a contact window for a source electrode can be determined in a self-aligned manner with respect to this narrow trench. The whole contents of U.S. Pat. No. 6,087,224 are hereby incorporated herein as reference material.

U.S. Pat. No. 6,087,224 discloses various forms of the method. Thus, for example, the source region and/or channel-accommodating region may be provided either before or after forming the trench-gate, either a deep or shallow more highly-doped region may be provided (also in a self-aligned manner) in the channel-accommodating region, either a doped-semiconductor or a metal or silicide material may be used for the gate, and either an oxidised or deposited insulating overlayer may be provided (also in a self-aligned manner) over the trench-gate.

It is an aim of the present invention to provide a modification of such a method, involving a novel sequence of process steps that can provide very good control of the doping concentration of the channel-accommodating region adjacent to the trench and that can provide other advantageous device features in relation thereto.

According to the present invention, there is provided such a method of manufacturing a trench-gate semiconductor device, for example an insulated-gate field-effect device, wherein:

(a) a narrow window is defined by providing sidewall extensions at the sidewalls of a wider window in a first mask at a surface of a semiconductor body, (b) a trench is etched into the body at the narrow window, and the gate is provided in the trench, (c) the source region is provided so as to adjoin a sidewall of the trench (and is preferably self-aligned with the trench-gate by means of the sidewall extensions), and (d) the channel-accommodating region is provided using the following sequence of steps:

removing the sidewall extensions to leave at least a part of the first mask at the surface of the body and to form a doping window between the first mask part and the trench-gate, and introducing dopant of a second conductivity type into the body at least via the doping window so as to form the channel-accommodating region adjacent to the sidewall of the trench and extending laterally below the first mask part.

By providing a doping window between the first mask part and the trench-gate, such a method in accordance with the present invention permits very good control of the doping concentration of the channel-accommodating region adjacent to the trench, while also permitting the channel-accommodating region to be provided after forming the trench-gate.

The inventors find that this method in accordance with the present invention provides an improvement over the detailed embodiments disclosed in U.S. Pat. No. 6,087,224. Thus, when the doping concentration was provided before etching the trench, it was affected by the subsequent formation of the trench-gate structure. When it was carried out after forming an insulating overlayer over the trench-gate, the doping concentration immediately adjacent the trench was affected by the insulating overlayer.

In a method in accordance with the present invention, the insulating overlayer can be provided after stage (d) in, for example, a self-aligned manner with respect the first mask part. Preferably a simple deposition and etch-back (planarization) process is used, that does not involve high (thermal oxidation) temperatures that might otherwise degrade the previously-provided channel-accommodating region doping. The resulting insulating overlayer may readily be formed over a slightly sunken trench-gate so as to extend inside an upper part of the gate trench. Alternatively or additionally, it may extend laterally from the trench into at least a part of the doping window between the first mask part and the trench-gate. In this way, a well-defined contact window can be defined for the source electrode, and reliable insulation can be provided over the trench-gate and the top corner of the gate trench to avoid short-circuits.

Methods in accordance with the present invention are particularly beneficial for manufacturing compact cellular devices, such as power MOSFETs. Thus, the first mask and its associated windows may have a layout geometry that defines device cells with a respective width to the first mask that is sufficiently small in relation to the lateral extent of the dopant provision in stage (d) as to allow the dopant introduced via the doping windows of the cell to merge together below the first mask.

In some embodiments, a drive-in thermal diffusion may be used to provide the channel-accommodating region dopant to a sufficient extent laterally below the first mask part. However, particularly in devices with sub-micron (less than 1 micrometer) lateral dimensions for this region, a high energy implant with a simple activation anneal can be most advantageous.

Preferably the implantation is carried out at a sufficiently high energy and in a sufficiently high dose that the dopant ions implanted at the doping window are scattered to a desired lateral extent below the first mask part. Preferably, the ion energy is so high that the dopant ions penetrate through the first mask part and are implanted in the underlying portion of the body.

The resulting doping profile can be remarkably uniform beneath the doping window and beneath the first mask part. In this way, the doping profile desired for the channel-accommodating region can be precisely and reproducibly implanted.

In order to control precisely the thickness of the first mask part used in this implantation, a composite first mask may be utilised in earlier stages. Thus, at stage (a) the first mask may comprise an upper layer part (e.g. of oxide) on a lower layer part (e.g. of nitride). This upper layer part may be etched away from the lower layer part before implanting the dopant ions through the lower layer part in stage (d).

Because the channel-accommodating region is provided after the trench-gate, high temperature processes that may be used to form the trench-gate structure (such as, for example, thermal oxidation to form a high-quality gate dielectric) do not affect the subsequently provided doping profile of the channel-accommodating region. Preferably the source doping profile is provided after forming the trench-gate structure so as not to be affected thereby. A simple and convenient way to form the source region is to introduce its doping concentration of the first conductivity type into the body via the doping window of stage (d).

Thus, in a convenient and preferred method in accordance with the invention, the trench is etched in stage (b) through a silicon body portion having a doping concentration of the first conductivity type that extends from the surface into an underlying area to provide a part of the drain region. In the case of an insulated-gate device, the gate dielectric may be formed by depositing an insulating layer on the walls of the trench. However, the gate dielectric layer may be formed by thermal oxidation of the silicon body portion at the walls of the trench. Thus, these earlier steps for forming the trench-gate structure do not disturb the subsequently-provided doping profiles of the source region and channel-accommodating region. Furthermore, the etching of the trench and thermal oxidation at its walls to form a high quality gate dielectric can be carried out in a homogeneous body portion, unaffected by the (subsequently-provided) source and channel region doping concentrations.

BRIEF DESCRIPTION OF THE DRAWINGS

These and other features in accordance with the present invention are illustrated in embodiments of the invention that are now described, by way of example, with reference to the accompanying drawings, in which.

Figure 1:
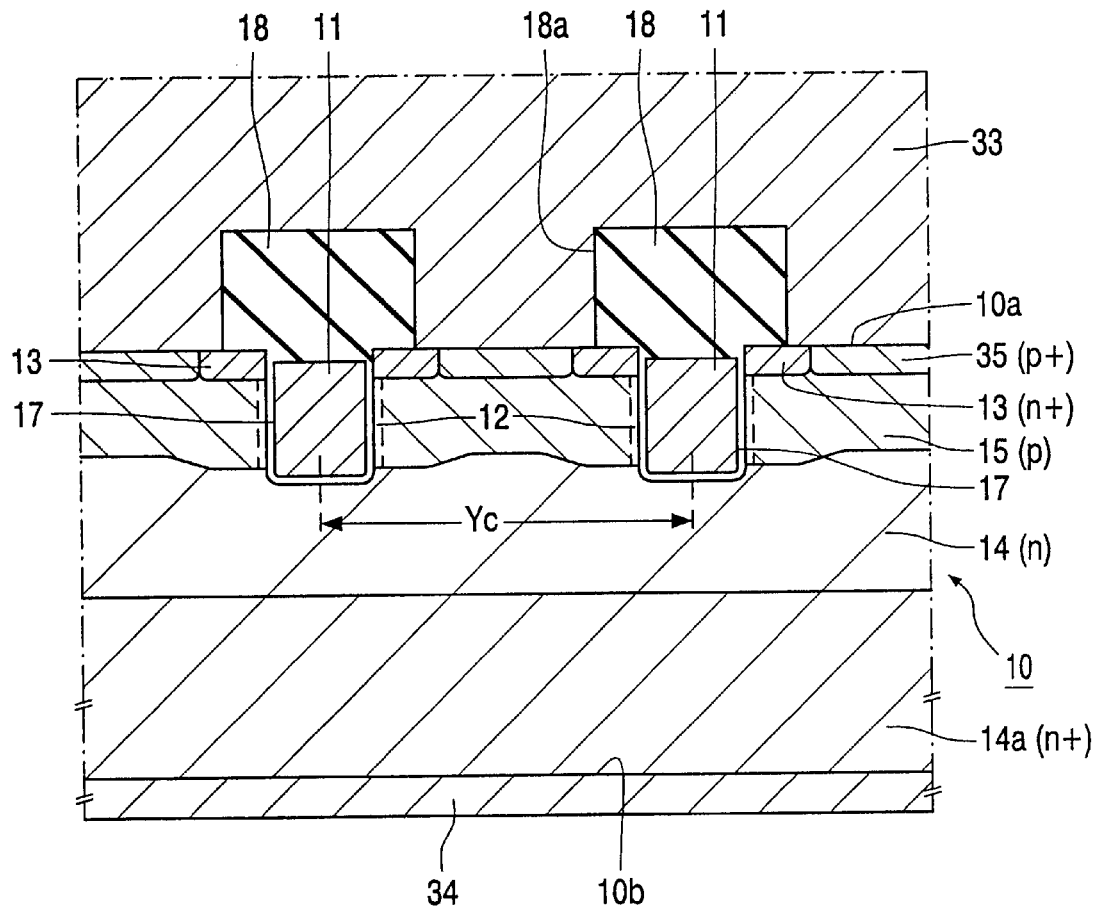
FIG. 1 is a cross-sectional view of an active central part of one example of a trench-gate semiconductor device manufactured in accordance with the invention.

It should be noted that FIGS. 1 to 11 and 14 to 24 are diagrammatic, with the relative dimensions and proportions of various parts of these drawings being shown exaggerated or reduced in size, for the sake of clarity and convenience in the drawings. The same reference signs are generally used to refer to corresponding or similar features in modified and different embodiments.

DETAILED DESCRIPTION

FIG. 1 illustrates an exemplary embodiment of a cellular power MOSFET device having an insulated trench-gate 11. In the transistor cell areas of this device, a channel-accommodating region 15 of a second conductivity type (i.e. p-type in this example) separates source and drain regions 13 and 14, respectively, of a first conductivity type (n-type in this example). The drain region 14 is common to all the cells. The gate 11 is present in a trench 20 that extends through the regions 13 and 15 into an underlying portion of the drain region 14. The gate 11 is capacitively coupled to the channel-accommodating region 15 by an intermediate dielectric layer 17 at the walls of the trench 20. The application of a voltage signal to the gate 11 in the on-state of the device serves in known manner for inducing a conduction channel 12 in the region 15 and for controlling current flow in this conduction channel 12 between the source and drain regions 13 and 14.

The source region 13 is located adjacent to the top major surface 10a of the device body 10, where regions 13 and 15 are contacted by a source electrode 33. The trench-gate 11 is insulated from the overlying electrode 33 by an intermediate insulating overlayer 18. FIG. 1 shows a vertical power device structure. The region 14 is a drain-drift region, which may be formed by an epitaxial layer of high resistivity on a more highly-doped substrate 14a of the same conductivity type. This substrate 14a is contacted at the bottom major surface 10b of the device body 10 by a drain electrode 34.

Typically the device body 10 is of monocrystalline silicon, and the gate 11 is typically of conductively-doped polycrystalline silicon. Typically, the intermediate gate dielectric layer 17 is of thermally grown silicon dioxide or deposited silicon dioxide.

The device of FIG. 1 is manufactured with self-aligned features by a method in accordance with the present invention, which includes the following stages:

(a) a narrow window 52a is defined (FIG. 4), by providing sidewall extensions 52 (commonly termed "spacers" 52) at the sidewalls of a wider window 51a in a first mask 51 (FIG. 3) at the top surface 10a of a semiconductor wafer body 100 (that provides the device body 10), (b) a trench 20 is etched into the body 100 at the narrow window 52a, and the insulated gate 11 is provided in the trench 20 (FIG. 5), (c) the source region 13 is provided (FIG. 8) so as to be self-aligned with the trench-gate 11 by means of the spacers 52, and (d) the channel-accommodating region 15 is provided using the following sequence of steps:

removing the spacers 52 (FIG. 6) to leave at least a part 51n of the first mask 51 at the surface 10a of the body 100 and to form a doping window 51b between the first mask part 51, 51n and the trench-gate 11, and introducing dopant 61 of a second conductivity type into the body 100 at least via the doping window 51b (FIG. 7) so as to form the channel-accommodating region 15 adjacent to the trench-gate 11 and extending laterally below the first mask part 51, 51n.

By providing a doping window 51b between the first mask part 51, 51n and the trench-gate 11, such a method permits very good control of the doping concentration of the channel-accommodating region 15 adjacent to the trench 20, while also permitting the channel-accommodating region 15 to be provided after forming the trench-gate 11. Furthermore, this method utilises the spacers 52 in accordance with invention disclosed in U.S. Pat. No. 6,087,224, for forming a narrow trench-gate 11 and for determining both the source region 13 and a contact window 18a for the source electrode 33 in a self-aligned manner with respect to the narrow trench 20. Indeed, a single masking pattern 45, 51 (which is photo-lithographically defined in FIG. 2) is used for determining, in a self-aligned manner, all subsequent windows (for etching, planarisation, doping, contacting, etc.) in the cell areas shown in FIGS. 1 to 11. This self-alignment simplifies the manufacture and permits a reproducible close spacing of the transistor cells, for example, with a cell pitch Yc of about 1 micrometer or less.

An important advantage of the present invention is the very good control of the doping profile of the channel-accommodating region 15 adjacent to the insulated trench-gate 11. This doping profile is important in determining the gate-controlled characteristics of the channel 12. It is precisely controlled in the present method by using a high-energy dopant-ion implant, as illustrated by the arrows 61 in FIG. 7. As described in due course, this doping process also is very well suited for closely spaced cells, for example, with a cell pitch Yc of about 1 micrometer or less.

Figure 2:
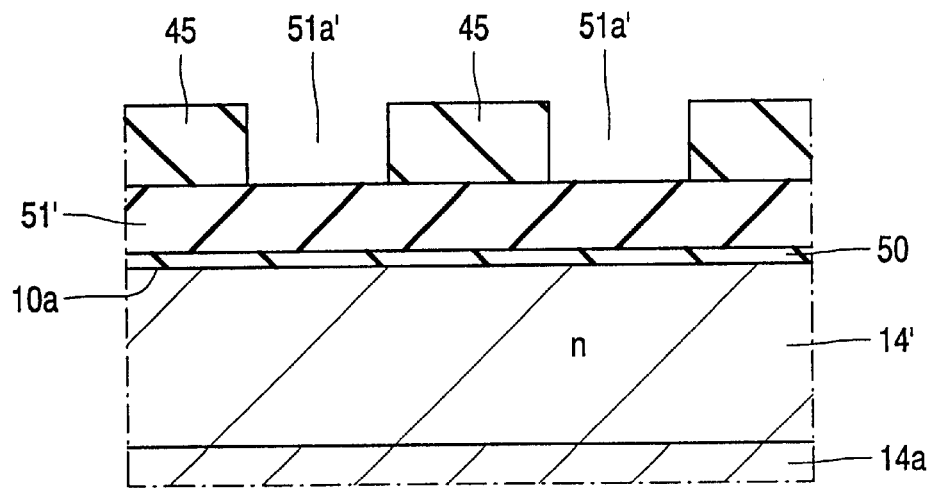
FIGS. 2 to 11 are cross-sectional views of the part of FIG. 1 at successive stages in its manufacture by one example of a method in accordance with the invention.
Figure 3:
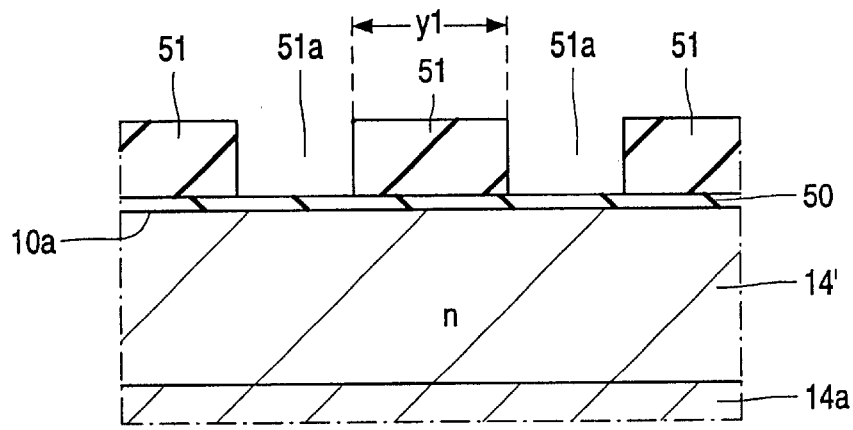

The cell pitch and the layout geometry of the device is determined by the photolithographic and etching stage illustrated in FIGS. 2 and 3. No plan view of the cellular layout geometry is shown in the drawings, because the method of FIGS. 1 to 11 may be used for quite different, known cell geometries. Thus, for example the cells may have a square geometry or a close-packed hexagonal geometry, or they may have an elongate stripe geometry. In each case, the trench 20 (with its gate 11) extends around the boundary of each cell. FIG. 1 shows only a few cells, but typically the device comprises many thousands of these parallel cells between the electrodes 33 and 34. The active cellular area of the device may be bounded around the periphery of the device body 10 by various known peripheral termination schemes (also not shown). Such schemes normally include the formation of a thick field-oxide layer in the peripheral device area at the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Successive stages in the fabrication of the transistor cells will now be described with reference to the sequence of FIGS. 2 to 11, by way of example of a specific embodiment.

Figure 4:
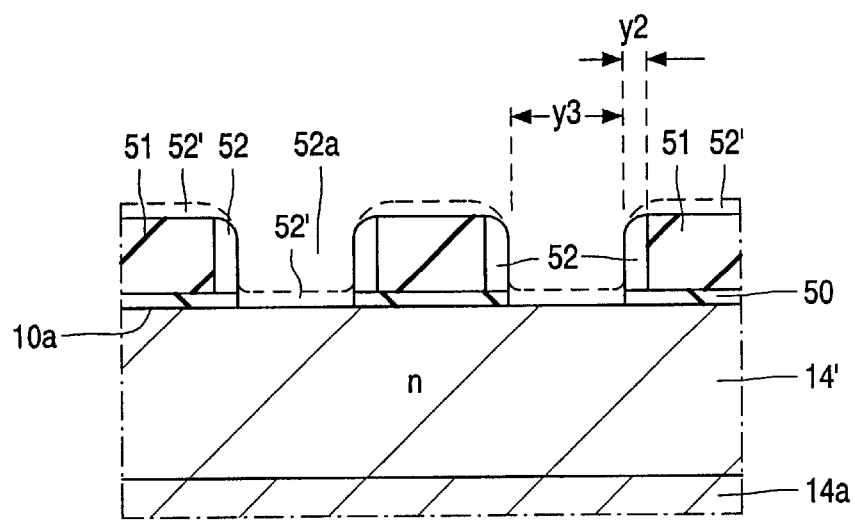
Figure 7:
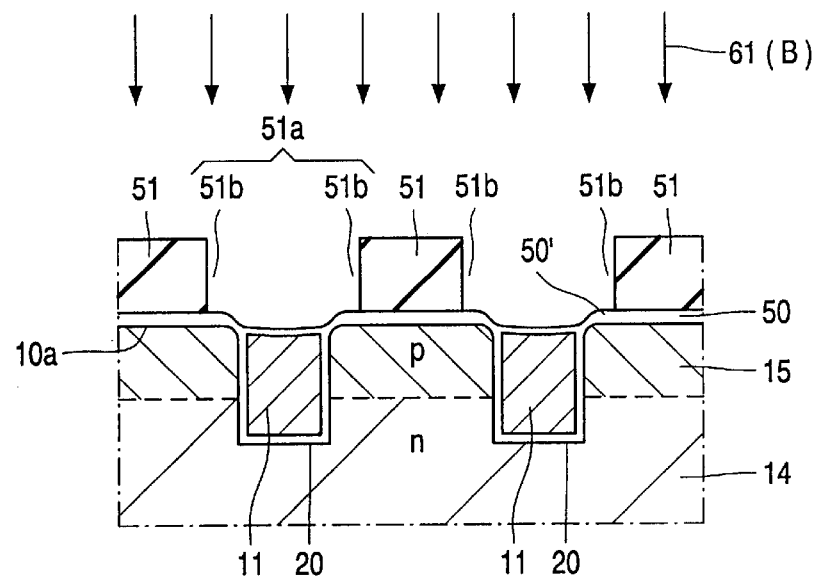
Figure 8:
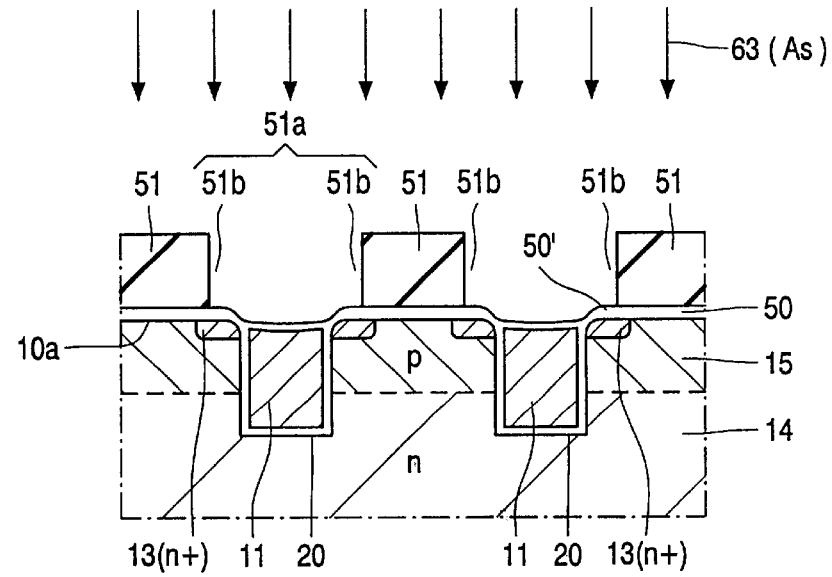
Figure 9:
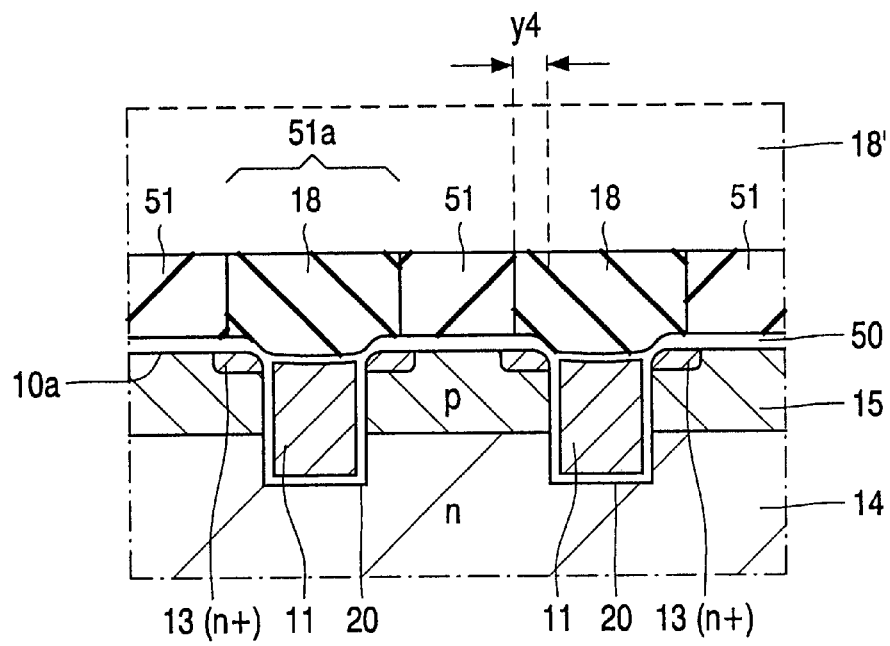

FIG. 2 illustrates the body part of FIG. 1 at an early stage in the device manufacture. In this specific embodiment, a thick silicon nitride layer 51' is deposited on a thin silicon dioxide layer 50 on the silicon body surface 10a. Typically the oxide layer 50 may be 30 nm to 50 nm thick. The thickness of the nitride layer 51' in this embodiment of FIGS. 1 to 11 is chosen in accordance with:

the desired depth & width proportions of the window 51a for formation of the spacers 52 in FIG. 4, its desired penetration by dopant ions 61 in the high-energy implant stage of FIG. 7, while masking the lower energy ions 63 of the FIG. 8 implant, and the desired thickness of the insulating overlayer 18 formed in the FIG. 9 planarisation stage.

In a particular device embodiment, by way of a specific example, the nitride layer 51' may be in the range of 0.4 $\mu$m to 0.5 $\mu$m thick, and window 51a may be about 0.51 $\mu$m wide.

The window 51a is defined using known photolithographic techniques. A photoresist mask 45 with a corresponding window 51a' is provided on the nitride layer 51' as illustrated in FIG. 2. This serves as an etchant mask for etching the window 51a into the layer 51' to form the mask 51 illustrated in FIG. 3. This mask 51 and its associated windows (51a of FIG. 3 and narrowed window 52a of FIG. 4) have a layout geometry that defines the layout of the device cells and their pitch Yc.

Thus, the windows 51a & 52a define the gate boundary of the cells which is, for example, an hexagonal network in the case of a close-packaged hexagonal cellular geometry. In whatever layout geometry is chosen, the width y1 of the mask 51 between neighbouring windows 51a is chosen (in the embodiment of FIGS. 1 to 11) in accordance with the desired contact area of contact window 18a for the electrode 33. Preferably, this width y1 is also such as to aid uniformity of doping profile in the FIG. 7 stage (d). Thus, width y1 of the penetrable mask 51 may be sufficiently small as to allow the dopant introduced via the doping windows 51b of the cell to merge into a substantially uniform doping profile below the mask 51. Particular examples are described later with reference to FIGS. 12A, 12B, 13A & 13B.

In this specific embodiment, an oxide layer 52' is now contour deposited on the top and sidewalls of the nitride mask 51 and at the bottom of the window 51a. This oxide layer 52' is then etched back in known manner, using a directional etch, to remove it from the top of the nitride mask 51 and from the bottom of the window 51a, while leaving the spacers 52 at the sidewalls. The etch-back also removes the exposed thin oxide layer 50 from the window 52a. Typically, the contour-deposited oxide layer 52' may be about 0.2 $\mu$m thick, so that the remaining width y2 of spacers 52 is in the range of 0.1 $\mu$m to 0.2 $\mu$m. FIG. 4 shows the resulting structure, with the narrower window 52a of width y3 as defined by the spacers 52 of width y2.

The trench 20 is now etched into the body 100 at the window 52a. As shown in FIGS. 2 to 5, the silicon body portion 14' into which the trench 20 is etched may have a doping concentration n of the same conductivity type from the surface 10a into the area that provides a part of the drain region 14, i.e. the drain drift region. This doping concentration n may be substantially homogeneous, for example about $2 \times 10^{16}$ or $3 \times 10^{16}$ phosphorus or arsenic atoms cm$^{-3}$. Alternatively, it may be graded from less than $5 \times 10^{16}$ (e.g. $1 \times 10^{16}$) phosphorus or arsenic atoms cm$^{-3}$ at the surface 10a to more than 10 times greater (e.g. $3 \times 10^{17}$ phosphorus or arsenic atoms cm$^{-3}$) at the interface with substrate 14a, as disclosed in U.S. Pat. No. 5,612,567.

In a specific embodiment, the depth to which the trench 20 is etched may be, for example, about 1.5 $\mu$m. This is three times the thickness of the mask 51 and so illustrates the extent to which the drawing proportions are distorted for convenience in these diagrammatic Figures.

A gate dielectric layer 17 is then formed, for example by thermal oxidation of the silicon body portion 14' at the walls of the trench 20. In the embodiment of FIGS. 1 to 11, this dielectric layer 17 lines the bottom as well as the sidewalls of the trench 20. Thereafter, the gate 11 is provided in known manner, by depositing gate material 11' to a thickness that is sufficient to fill the trench 20 and to extend above the window 52a and over the mask 51, 52, and then etching back the gate material 11' to leave it forming the trench-gate 11. Typically, the gate 11 may comprise doped polycrystalline silicon or other semiconductor material. Its doping concentration may be provided while the material 11' is being deposited or after deposition, for example at the etch-back stage illustrated in FIG. 5. In this embodiment, this gate doping concentration is of the first conductivity type (n-type in this example), and it is of greater magnitude than the doping concentration of the second conductivity type introduced in the FIG. 7 stage (d) for the channel-accommodating region 15.

Figure 6:
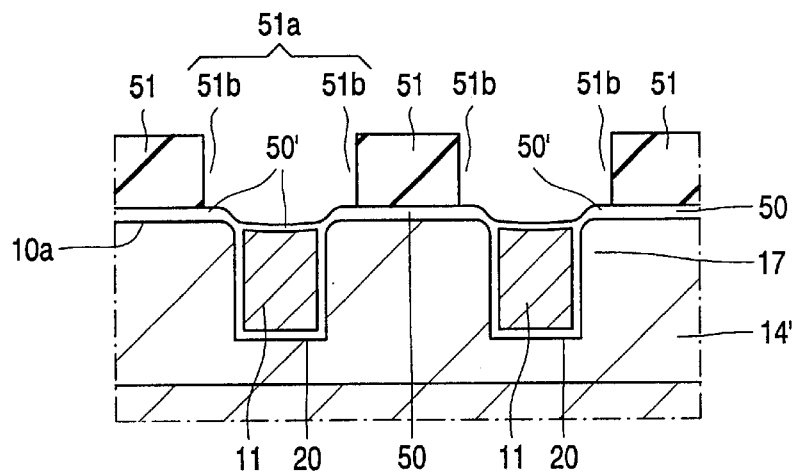

The oxide spacers 52 are now etched away to re-open the window 51a and so to form the doping window 51b between the mask 51 and the trench-gate 11. This etch also removes the thin oxide 50 under the oxide spacers 52. As the window 51b is to be used for implantation, a thin oxide 50' is now regrown in this window 51a on the exposed area of the silicon body surface 10a (and also grows on the exposed silicon gate 11). The resulting structure is shown in FIG. 6.

The high-energy dopant-ion implant illustrated in FIG. 7 is now carried out. The dopant ions 61 are implanted at a sufficiently high energy and in a sufficiently high dose that those dopant ions 61 that are implanted at the doping window 51b are scattered laterally below the mask 51. The ion energy is sufficiently high that those dopant ions that impinge on the mask 51 penetrate through the mask 51 so as to be implanted in the underlying portion of the body 100. Typically, the dopant ions may be of boron having an implantation energy in excess of 200 keV. Although the trench-gate 11 is not masked against this implantation, the boron doping concentration is insufficient to over-dope that of the polycrystalline silicon gate material.

Figures 12A, 12B:
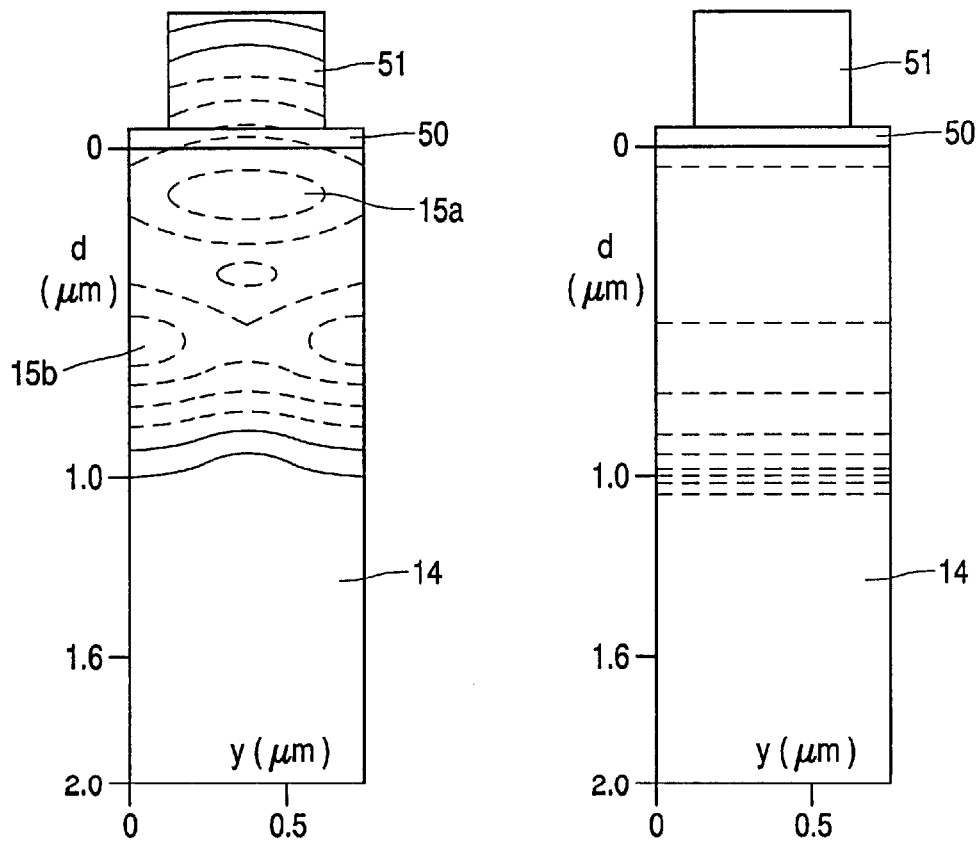
FIGS. 12A and 12B are computer simulations of doping contours achieved with one example of a high energy implant suitable for the FIG. 7 stage, with depth d in $\mu$m (micrometers) and lateral distance y in $\mu$m (micrometers), the contours of FIGS. 12A and 12B being respectively before and after annealing the implant.

FIGS. 12A, 12B, 13A, & 13B illustrate (as a specific example) a dose of $2 \times 10^{13}$ cm$^{-2}$ boron ions at an ion energy of 260 keV. The thickness of nitride layer 51 is 0.4 $\mu$m in this specific example. FIG. 12A illustrates the implanted doping contour before annealing. This un-annealed contour includes a peak doping concentration 15b at a depth d of about 0.6 $\mu$m below the surface 10a at window 51b, and a peak doping concentration 15a at a depth d of about 0.1 $\mu$m below the nitride layer 51. However, at this energy and dose, the dopant ions 61 implanted at the window 51b are scattered laterally at least 0.4 $\mu$m below the first mask part. This scattering contributes to achieving homogeneity in the doping concentration of the region 15.

Figure 13A:
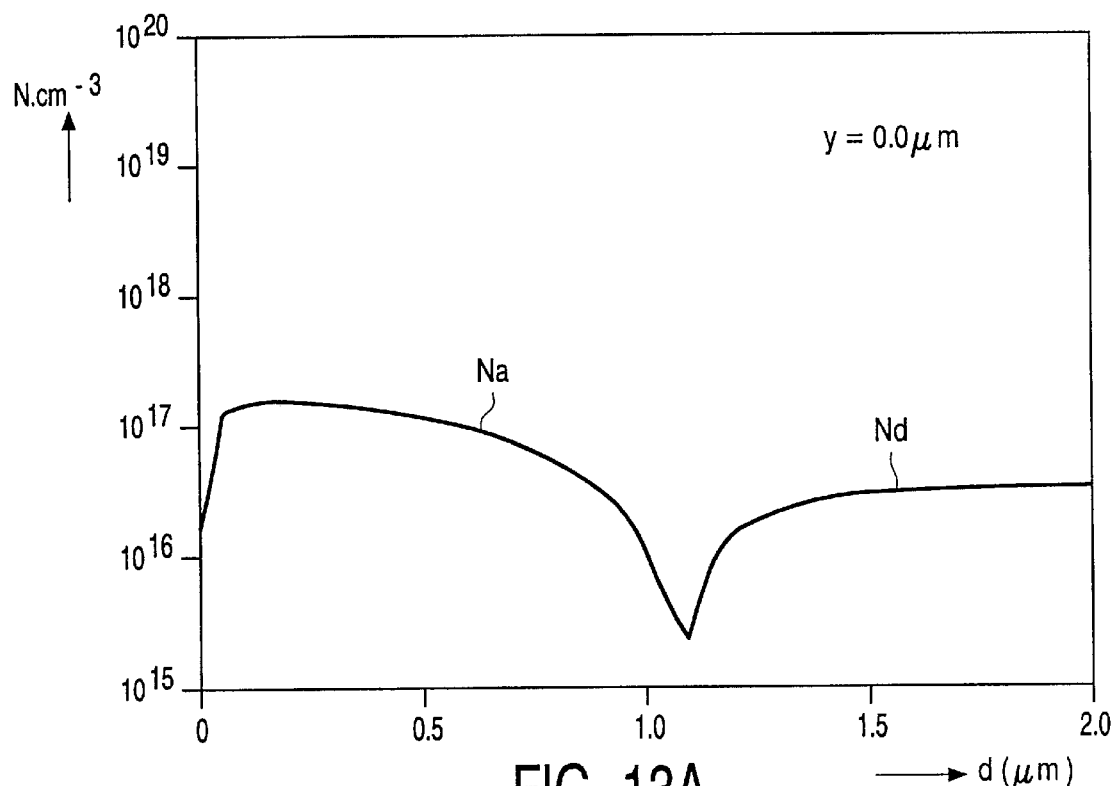
FIGS. 13A and 13B are computer simulations of vertical doping profiles in terms of the left doping concentration N.cm$^{-3}$ through the channel-accommodating region and into the drain drift region, for the particular example of FIG. 12B, the profiles of FIGS. 13A and 13B being respectively immediately adjacent to the trench(i.e. y=0.0) and a lateral distance y of 0.4 $\mu$m (micrometers) from the trench.
Figure 13B:
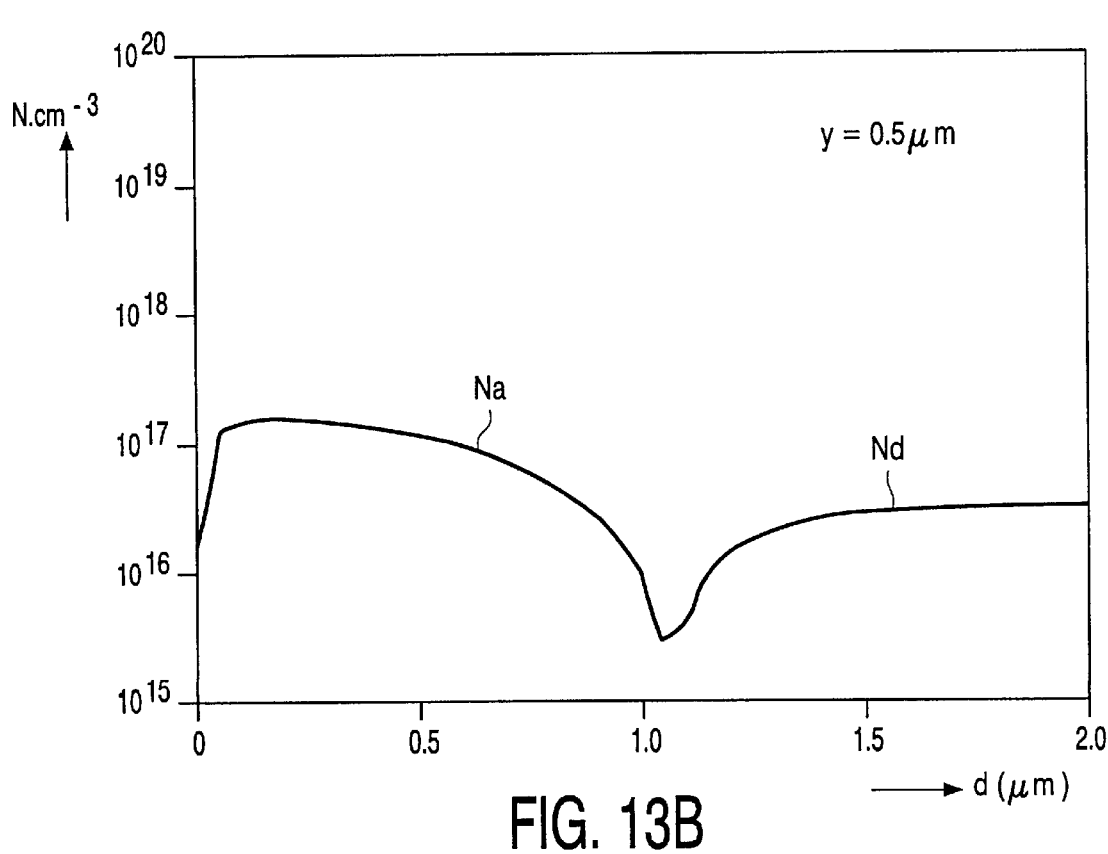

A heating step, for example 1,100° C. for 40 minutes, is then carried out in order to anneal the implantation damage and activate the dopant. FIGS. 12B, 13A, & 13B illustrate the situation after this short heating step, from which it is evident that some thermal diffusion of the implanted dopant has also occurred. This diffusion also contributes to achieving homogeneity in the doping concentration of the region 15.

FIGS. 13A, & 13B illustrate how remarkably uniform is the resulting doping profile, beneath the window 51b and beneath the layer 51. The boron doping concentration Na has now become almost uniform from immediately adjacent to the trench 20 (FIG. 13A) to a lateral distance y=0.4 $\mu$m from the trench 20, i.e. at a central cell area below the 0.4 $\mu$m thick nitride layer 51. The lateral distances y in FIGS. 12A, 12B, 13A, & 13B correspond to the dimensions (y1+y2) that will be present with a cell pitch Yc of 1.0 $\mu$m. As such, they illustrate the suitability of this process for fabricating devices with small cell pitch.

The doping concentration n+ of the source region 13 is also introduced into the body 100 via the doping window 51b. In this case, the nitride layer 51 acts as a mask. As illustrated in FIG. 8, this source doping is preferably carried out by implantation of arsenic ions 63. Typically, a very high dose is used to provide a doping concentration of $10^{20}$ to $10^{22}$ arsenic atoms cm$^{-3}$. The ion energy is typically about 30 keV. At this dose and energy, the arsenic ions are scattered below the edge of the mask 51. After one or more short anneals, for example 900° C. for 1 hour during the stages of FIGS. 9 and 10, the source region typically extends laterally about 0.1 $\mu$m to 0.2 $\mu$m beyond the window edge line of the mask 51.

As illustrated in FIG. 9, the insulating overlayer 18 is now provided over the trench-gate 11 in the wider window 51a of the first mask 51. This is achieved most conveniently by a planarisation process, in which insulating material 18' (for example, silicon dioxide) is deposited to a thickness that is sufficient to fill the window 51a and to extend above window 51a and over the mask 51. Then the insulating material 18' is etched back to leave it over the trench-gate 11 and in the doping window 51b. The thickness of the resulting overlayer 18 is at most corresponding to the thickness of the mask 51 at this stage of the manufacture. In a specific example, the overlayer 18 may be between 0.3 $\mu$m and 0.4 $\mu$m thick. The lateral extent y4 of its overlap with the silicon body surface 10a is reproducibly determined by the width y2 of the spacers.

Figure 10:
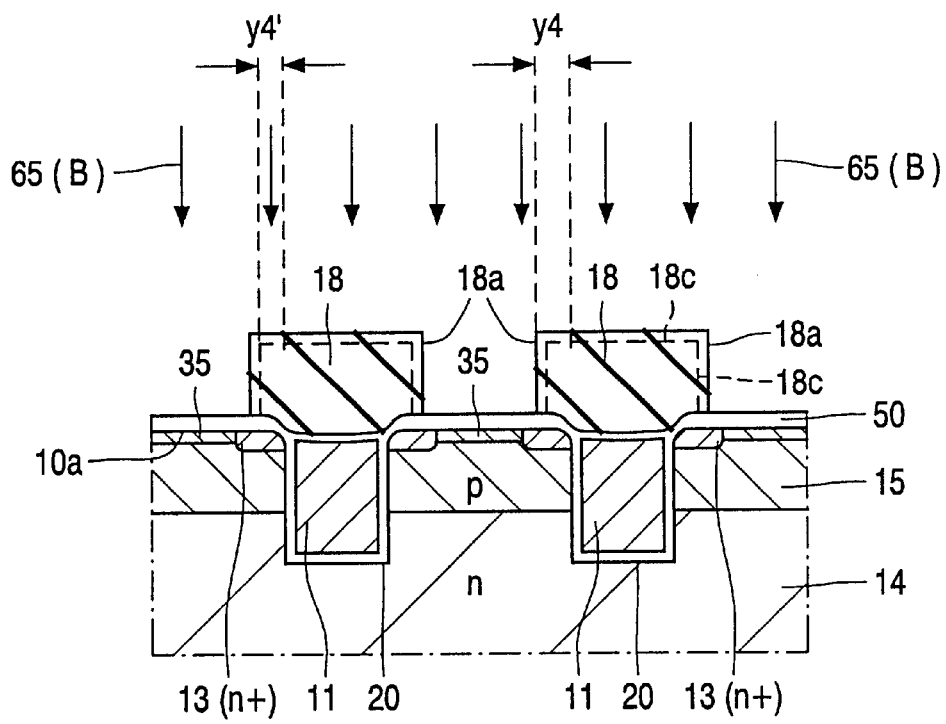

The nitride mask 51 is then removed to form the window 18a in the insulating overlayer 18, as illustrated in FIG. 10. Dopant of the second conductivity type (i.e. p-type) is then introduced into the body 100 via the contact window 18a so as to form a more highly doped contact region 35 for the channel-accommodating region 15. This is preferably achieved by implanting boron ions 65, as illustrated in FIG. 10. The resulting boron concentration is in-sufficient to over-dope the exposed source region area at the window 18a. Typically, this doping concentration may be, for example, about $10^{19}$ boron atoms cm$^{-3}$.

As determined by its lateral extent below the mask 51, the source region 13 extends laterally into this window 18a. This lateral extent may be sufficient for a good low-resistance contact to the source electrode 33. FIG. 10 illustrates the thin oxide 50 being present at the implantation window 18, and a short dip etch may be used to remove this oxide layer 50 and so open the window 18a as the contact window. Even with a very short etch, some isotropic etch-back of the oxide layer 18 will also occur (both vertically and laterally) during this removal of the oxide layer 50. However, the overlayer 18 of FIG. 10 may be isotropically etched back a further distance by prolonging the etching to increase the area of the source region 13 not covered by the layer 18, if a wider contact area is desired. This further etch-back is illustrated by broken lines 18c in FIG. 10 and by the reduction of y4 to y4'.

Figure 11:
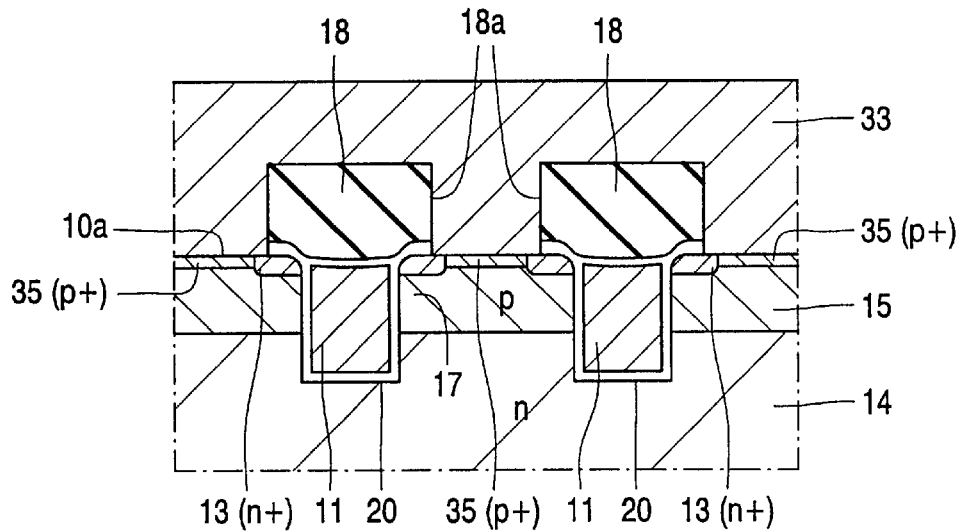

After so opening and/or widening the contact window 18a, the source electrode 33 is deposited as illustrated in FIG. 11. It contacts both the source region 13 and the contact region 35 at the contact window 18a and extends over the insulating overlayer 18 over the trench-gate 11. Typically, it comprises a thick layer of aluminium on a silicide contact layer. Its layout is defined (by known photo-lithographic and etching techniques) into separate metallisation areas that form the source electrode 33 and also a gate bondpad that is connected to the trench-gate 11. The gate bondpad metalli-sation and its connection are outside the plane of the FIG. 11 drawing. The back surface 10b is then metallised to form the drain electrode 34, after which the wafer body 100 is divided into the individual device bodies 10.

It will be evident that many modifications and variations are possible within the scope of the present invention. Considerable flexibility is possible in the specific technolo-gies that can be used in and between stages (a) to (d) of the method (for forming spacers 52, a narrow trench 20, trench-gate 11, source region 13 and the channel-accommodating region 15) and in the formation of other parts of the device. Thus, further novel features (as well as many features in the prior art) may be used in conjunction with the present invention.

Figure 5:
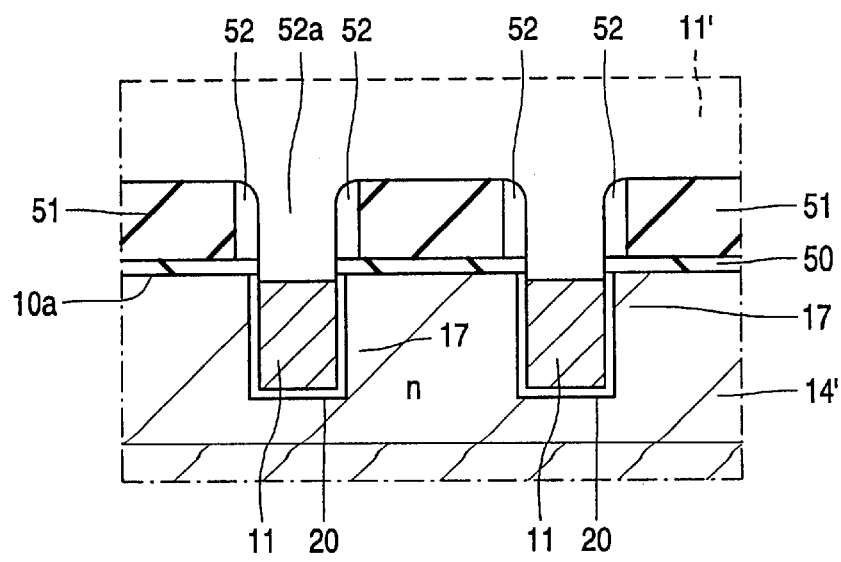

By way of example, FIG. 5 illustrates the etch-back of the gate material 11' stopping slightly below the body surface 10a. In this case, the insulating overlayer 18 of FIG. 1 extends slightly into the upper part of the trench 20, as well as laterally over the adjacent area of the surface 10a. This configuration for the overlayer 18 is particularly advanta-geous in providing very reliable protection against an unde-sirable short-circuit at the top corner of the gate trench 20, as illustrated in the enlarged view of FIG. 14.

Figure 14:
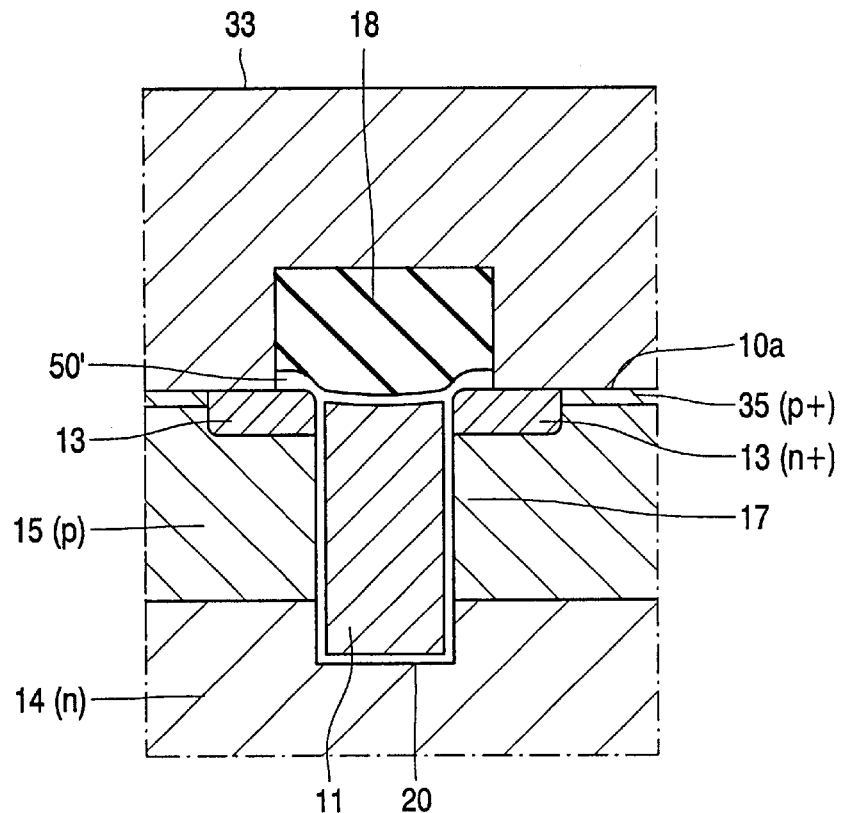
FIG. 14 is a enlarged cross-sectional view of a specific example of the insulated gate trench structure of a trench-gate semiconductor device manufactured in accordance with the invention.

Thus, during exposure to various process stages after the provision of the gate dielectric 17, some erosion of the gate dielectric 17 may occur at the top corner of the gate trench 20. This erosion may risk forming an undesirable short-circuit in the final device, between the gate 11 and the source region 13 and/or source electrode 33. However, as illustrated in FIG. 14, the deposited and etched-back oxide material 18 is left to form an insulating plug in the upper part of the trench 20 and extends laterally from the trench 20 as an insulating cap at the trench-edge of the source region 13. This combined plug and cap configuration of the overlayer 18 provides very reliable insulation of the top corner of the gate trench 20 and so protects against such a short-circuit.

However, the etch-back of the gate material 11' may be stopped coincident with the level of the body surface 10a or even when slightly higher than the body surface 10a. In the latter case, the trench-gate 11 will also protrude slightly above the level of the body surface 10a, and the overlayer 18 will extend (in the space vacated by the spacers 52) up and over the protruding trench-gate 11 instead of down into the trench 20.

FIGS. 15 to 18 illustrate a modification, in which a contact window 18a is formed that includes the doping window 51b. In this modification, the overlayer 18 is simply an insulating plug in the upper part of the trench 20. In this case, the trench 20 is etched to a slightly greater depth in the FIG. 5 stage. The insulated gate 11 is then provided in a part of the trench 20 below the level of the body surface 10a, i.e. below an upper part 20a of the trench. This is simply achieved by etching back the gate material 11' farther than in FIG. 5. Thereafter the doping window 51b is opened by removing the spacers 52, and the regions 15 and 13 are implanted similar to FIGS. 7 and 8, but at a slightly greater depth.

Figure 16:
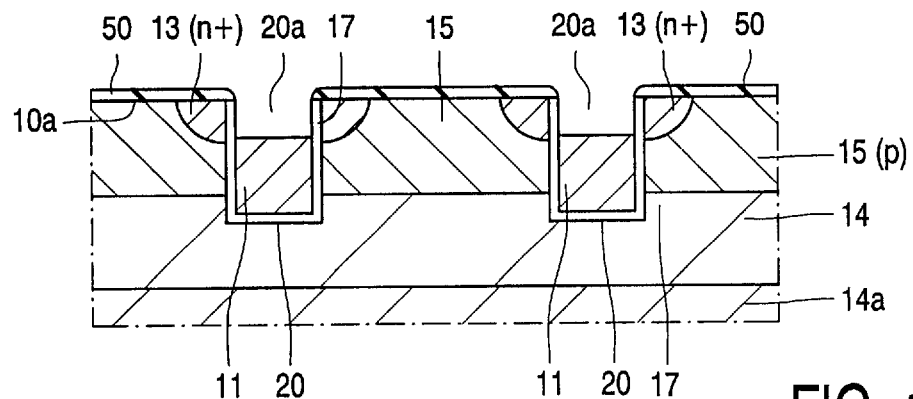
FIGS. 16 to 18 are cross-sectional views of the part of FIG. 15 at successive stages in its manufacture by another example of a method in accordance with the invention.
Figure 17:
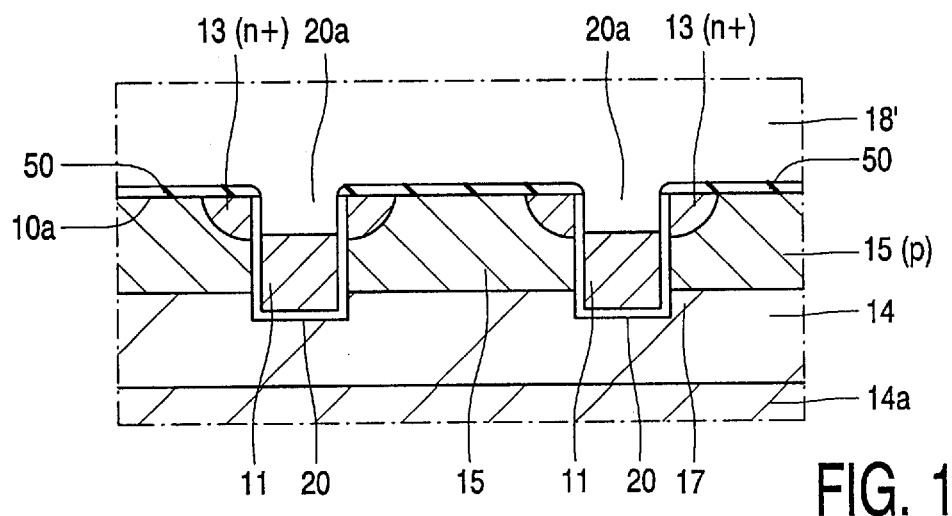

The mask 51 may then be removed to produce the structure illustrated in FIG. 16. Insulating material 18' is then deposited (FIG. 17) and etched back as in FIG. 9, except that it is left to form the insulating plug 18 in the upper part 20a of the trench 20, see FIG. 18. When the mask 51 is of different material (e.g. nitride) compared with material 18' (e.g. oxide), the FIG. 18 structure may also be obtained by removing the mask 51 after depositing and etching back the insulating material 18'.

Figure 15:
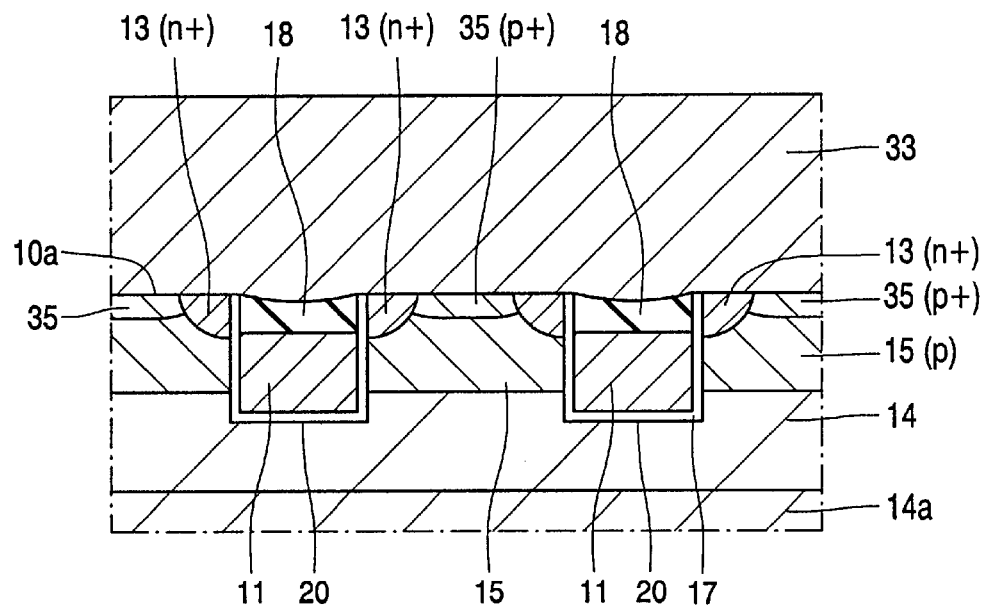
FIG. 15 is a cross-sectional view of an active central part of another example of a trench-gate semiconductor device manufactured in accordance with the invention.
Figure 18:
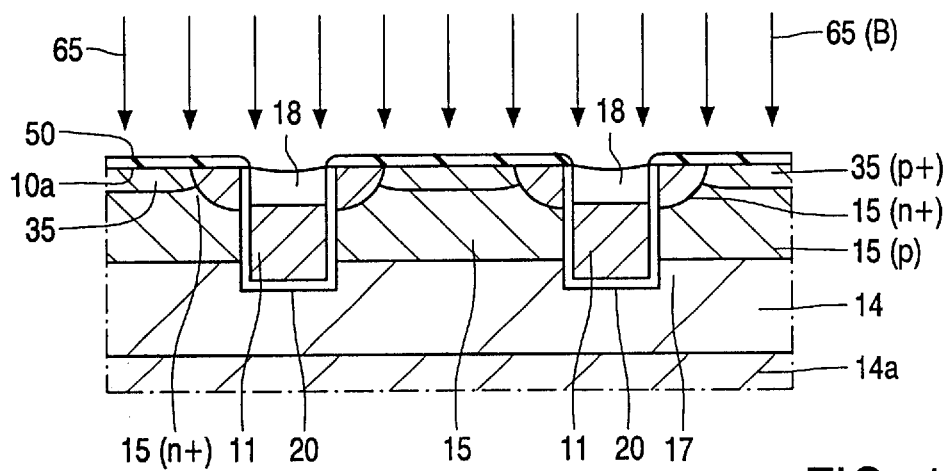

As illustrated in FIG. 18, the contact region 35 may then be formed by implanting boron ions 65 similar to FIG. 10, except that the implantation occurs at the wider window 18a that also includes the window 51b. FIG. 15 illustrates the resulting device structure after depositing the source elec-trode 33.

A specific embodiment of FIGS. 14 to 18 may utilise a mask 51 of nitride and spacers 52 of oxide, i.e. as in the specific embodiment of FIGS. 1 to 11. However, other materials may be utilised as described below, for example a mask 51 of oxide and spacers 52 comprising polysilicon.

In the specific embodiments described so far with refer-ence to FIGS. 1 to 18, the mask 51 and spacer 52 are each composed of a respective single material (silicon nitride; silicon oxide). Other embodiments are possible in which composite layers of different materials are used. Thus, for example, a thick composite mask 51 may be used at an early stage in the process, after which the mask 51 may be thinned by removal of an upper part. The pending PCT patent application EP01/09330 (and corresponding U.S. patent application Ser. No. 09/932073 and GB patent applications 0020126.9 & 0101690.6; our ref: PHNL010059) disclose the use of composite sidewall spacers. In particular, there is disclosed a trench-etch mask (51) of oxide, whose windows are narrowed by composite sidewall spacers (52) that com-prise polysilicon on a thin layer of silicon nitride.

In a modified embodiment of the present invention, the mask 51 may be of silicon nitride and the spacers 52 may be a composite of polysilicon on a thin nitride layer (50'). However, a further modification is possible in which oxide is used instead of nitride.

Figure 19:
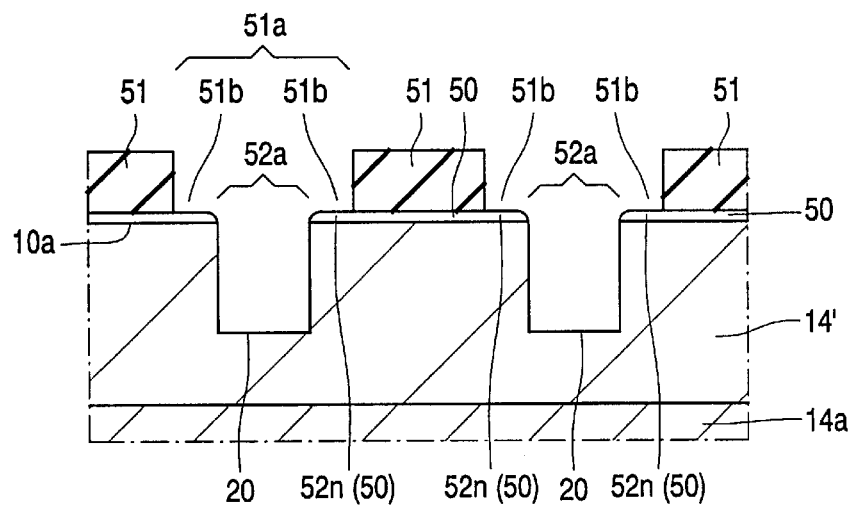
FIG. 19 is a cross-sectional view of a corresponding active central part of a trench-gate semiconductor device at the trench-etch stage in a modified method of manufacture in accordance with the invention.

Thus, in a modification of the embodiment of FIGS. 14 to 18, for example, the mask 51 may be of silicon dioxide, and the spacers may be a composite formed by contour-depositing a polysilicon material 52' on a thin oxide layer 50'. In this case, when the trench 20 is etched into the body region 14' as illustrated in FIG. 19, the etching also removes the polysilicon part (52m, not shown) of the spacers 52. The resulting structure is illustrated in FIG. 19. The narrowed trench-etch window 52a remains defined by thin oxide layer 50' (i.e. the lower spacer part 52n). Then the gate dielectric 17, gate 11, and regions 13 and 15 are provided as already described in embodiments of the present invention. Thereafter, the oxide 51 and 50' is etched away to leave the structure of FIG. 16 which is then further processed as already described.

In terms of the specific embodiments so far described with an original mask 51 wholly of silicon nitride, it is noted that oxy-nitride is formed at its surface when exposed to oxid-ising environments as the manufacturing process sequence progresses. Thus, for example, at the stage of FIG. 6 and/or FIG. 9, the nitride mask 51 may include a skin of oxy-nitride that is etched away when the oxide spacers 52 and/or oxide material 18' are etched, so thinning the mask 51 at these stages. This might introduce some uncertainty in thickness of the mask part 51 that remains for the implantation stage of FIG. 7 and the oxide planarisation stage of FIG. 9.

Figure 20:
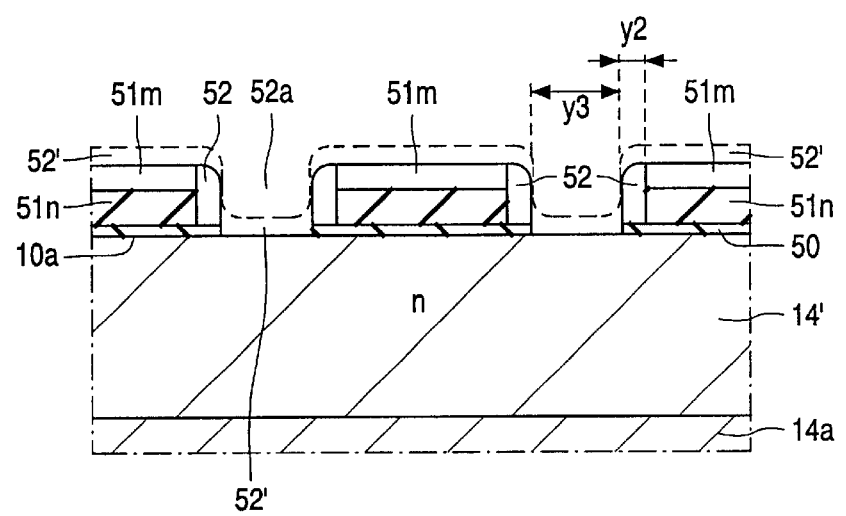
FIGS. 20 and 21 are cross-sectional view of a corresponding active central part of a trench-gate semiconductor device at the FIGS. 4 and 7 stages in a modified method of manufacture in accordance with the invention.
Figure 21:
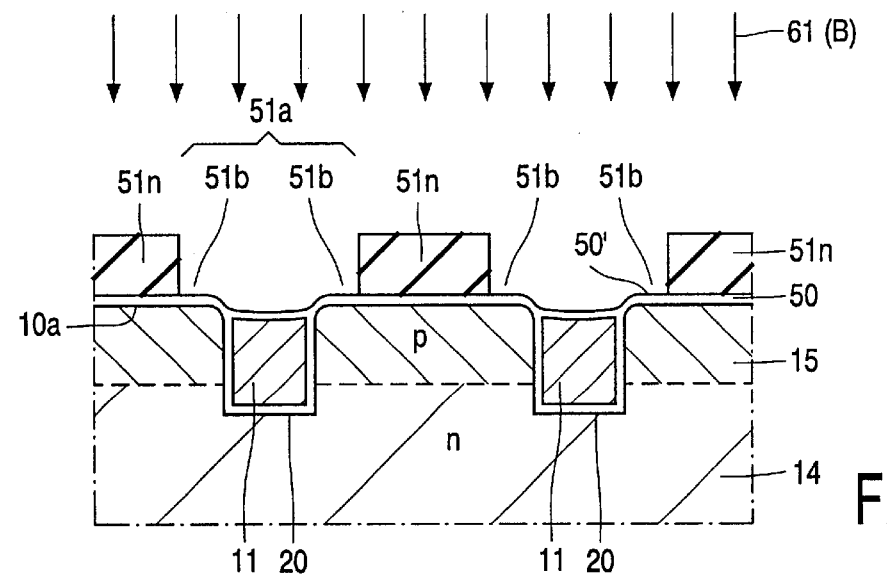
Figure 22:
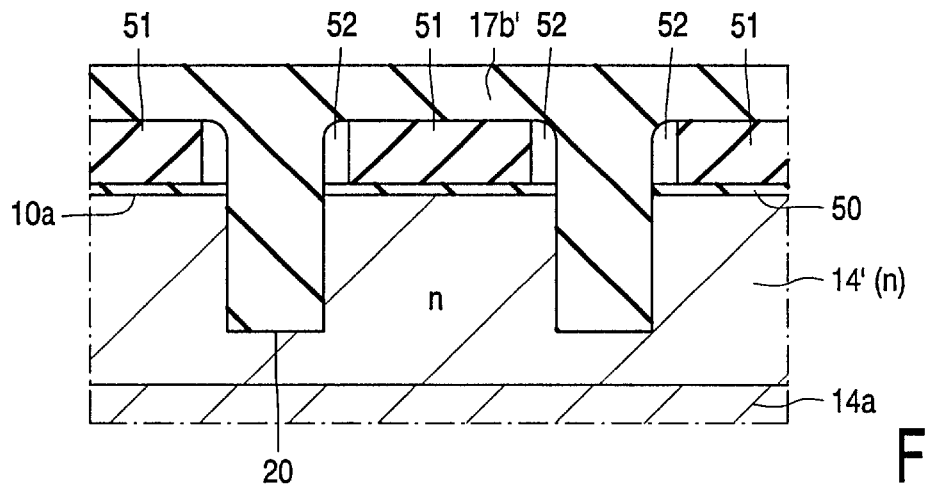
FIGS. 22 to 24 are cross-sectional views of an active central part of a further example of a trench-gate semiconductor device at successive stages in its manufacture by a further example of a method in accordance with the invention.
Figure 23:
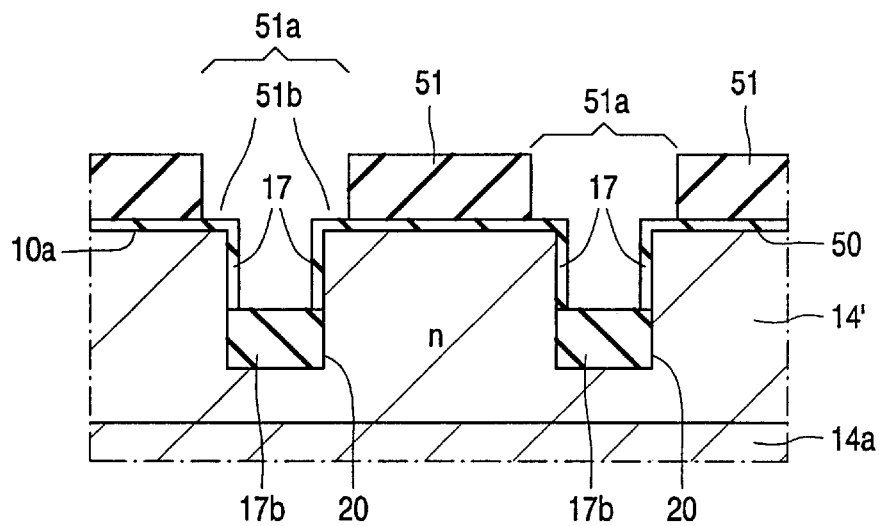
Figure 24:
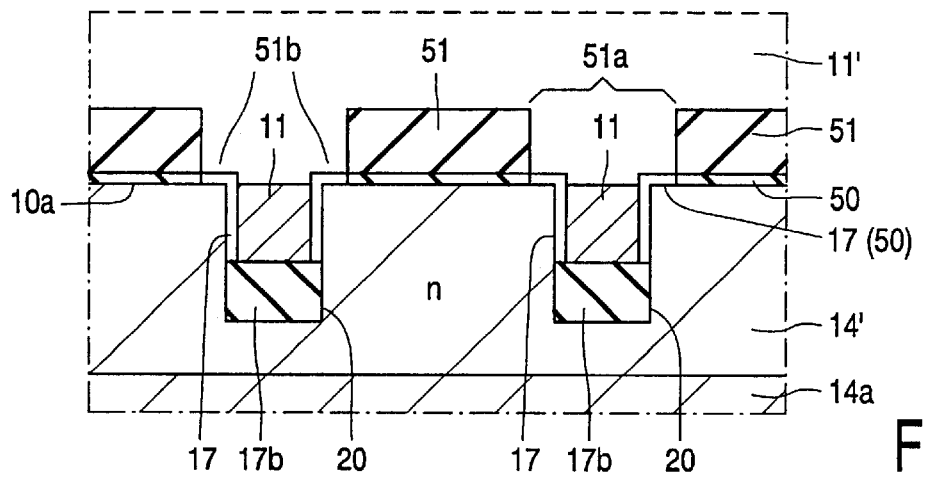

The occurrence of this uncertainty can be avoided by forming the first mask 51 in stage (a) as a composite comprising an upper layer part 51m on a lower layer part 51n. The upper layer part 51m is of a different material (e.g. of oxide) to the lower layer part 51n (e.g. nitride) so as to etchable from the lower layer part 51n. Such a composite mask 51m, 51n is illustrated in FIG. 20 as a modification of FIG. 4. The upper layer part 51m is etched away from the lower layer part 51n before implanting the dopant ions 61 through the lower layer part 51n in stage (d), as illustrated in FIG. 21. The lower mask part 51n may be thinner than the whole mask 51 so that a lower ion energy may be used for the boron ions 61. A further advantage of having a thinner nitride layer 51n (as compared with a thick nitride layer 51) is that there is less strain on the silicon wafer body 100, and so less bowing of the wafer body 100 during manufacture.

In the embodiments of FIGS. 1 to 21, the dopant ions 61 implanted for the channel-accommodating region 15 are of such a high energy as to penetrate the layer 51 (or its remaining part 51n). In these embodiments the desired doping profile for the channel-accommodating region 15 is precisely and reproducibly implanted, without a long drive-in diffusion.

However, a drive-in diffusion may be used for some devices, particularly for those with much larger cell pitch Yc and/or particularly where the mask 51 or its remaining part 51n masks against the dopant 61. Thus, the channel-accommodating region 15 of such devices may be formed by diffusing dopant 61 of the second conductivity type (p-type in these examples) laterally below the first mask part 51, 51n. The dopant 61 may be ion implanted or diffused in stage (d) at the doping window 51b formed by removing the spacers 52.

It is even possible to provide one or more wider cells in a device, in which the lateral extent of the p-type dopings provided via the doping windows 51b in stage (d) is insufficient to merge these dopings at the centre of the cell. Such a device with un-merged regions 15 may include a breakdown p-n diode at the centre of the cell. The breakdown diode can be formed by a p-n junction between the p+ region 35 and an underlying n+ region in the drift region 14. Such a structure has similarities to those disclosed in U.S. Pat. No. 5,527,720 (our ref: PHB33805) and in U.S. Pat. No. 6,121,089. The whole contents of both U.S. Pat. No. 5,527,720 and U.S. Pat. No. 6,121,089 are also hereby incorporated herein as reference material.

In the embodiments of FIGS. 1 to 17, the source region 13 is formed most conveniently by implanting dopant ions 63 at the doping windows 51b formed by removing the spacers 52. However, the spacers 52 may be used in other ways to provide self-alignment of the source region with the trench-gate.

In one such alternative way, the source region 13 may be diffused into the body 100 from an arsenic or phosphorus doping in the spacers 52 themselves.

In another alternative way, the source region 13 may be formed from an n-type layer 13' at the surface 10a. This can be achieved by providing the doped layer 13' before the mask 51, and etching through the layer 13' to the underlying region 15 while using the lateral extension y4 of the overlayer 18 (see FIG. 10) on the surface 10a as an etchant mask. This lateral extension of the overlayer 18 is determined by the spacers 52. This etch definition of the source region 13 may be carried out before etching back the overlayer 18 as illustrated by the broken lines 18c in FIG. 10.

In a further alternative form, the source dopant 63 may be implanted at the windows 51a at the FIG. 3 stage, so providing an initial source region 13' at the whole of this window 51a before forming the spacers 52. Thereafter, the layer 52' is deposited, the spacers 52 are formed as in FIG. 4, and then the trench 20 is etched at the narrow window 52a as in FIG. 5. In this case, the trench 20 is etched through the initial region 13' and into the body portion 14'. The parts of the region 13' that remain below the spacers 52 form the source region 13 self-aligned with the trench 20. This process sequence for forming the source region 13 is less advantageous than that of FIG. 8, because the highly-doped implanted region 13' typically etches slightly faster than the body portion 14' so widening the upper part of the trench 20.

Instead of forming the drain-drift region 14 by an epitaxial layer on a higher-doped substrate 14a, the higher doped region 14a of some devices may be formed by dopant diffusion into the back surface 10b of a high-resistivity substrate that provides the drift region 14. The devices so far described are MOSFETs in which the higher-doped substrate 14a or region 14a is of the same conductivity type (n-type in this example) as the drain drift region 14. However, the higher-doped substrate 14a or region 14a may be of opposite conductivity type (p-type in this example) to provide an IGBT. The electrode 34 is called an anode electrode in the case of an IGBT.

A vertical discrete device has been illustrated with reference to FIGS. 1 to 17, having its second main electrode 34 contacting the substrate or other region 14a at the back surface 10b of the body 10. However, an integrated device is also possible in accordance with the invention. In this case, the region 14a may be a doped buried layer between a device substrate and the epitaxial low-doped drain region 14. This buried layer region 14a may be contacted by an electrode 34 at the front major surface 10a, via a doped peripheral contact region which extends from the surface 10a to the depth of the buried layer.

The conductive gate 11 may be formed of doped polycrystalline silicon as described above. However, other known gate technologies may be used in particular devices. Thus, for example, other materials may be used for the gate, such as a metal silicide. Alternatively, the whole gate 11 may be of a refractory metal instead of polycrystalline silicon.

In the embodiments of FIGS. 1 to 17, the gate dielectric layer 17 lines the bottom as well as the sidewalls of the trench 20. However, other embodiments are possible in which the trench 20 is slightly deeper and has thick insulating material 17b in its bottom. The thick insulator 17b at the bottom of the trench 20 reduces the gate-drain capacitance of the device. Such an embodiment is illustrated in FIGS. 18 to 20.

In this case, the slightly-deeper trench 20 is etched at the narrow window 52a defined by the oxide spacers 52. Thereafter, insulating material 17b' is deposited to a sufficient thickness to fill the trench 20 and to extend above the trench 20 and over the spacers 52 and mask 51. The material 17b' may be, for example, silicon dioxide. This stage is illustrated in FIG. 18.

The material 17b' is then etched back until it is left in only the lower part of the trench 20 to form the thick insulator 17b. This etch-back also removes the oxide spacers 52 and so re-exposes the wider window 51a. Thereafter, the thin gate-dielectric layer 17 is provided at the exposed sidewalls of the trench 20 and also at the surface 10a where the oxide layer 50 was removed together with the spacers 52. The resulting structure is illustrated in FIG. 19.

Gate material 11' is then deposited to fill the wide window 51a and the trench 20 therein and extends on the mask 51. The gate material 11' is then etched back to be left as the gate 11 in the trench 20, as illustrated in FIG. 20. In this case, as illustrated in FIGS. 19 and 20, the spacers 52 are removed to define the window 52b before the gate 11 is provided in the trench 20. After the FIG. 20 stage, the regions 15 and 13 are formed by dopant implantations 61 and 63 as in FIGS. 7 and 8, followed by subsequent processing as illustrated in, for example, FIGS. 9 to 11.

Although thermal oxides are preferred for a high-quality gate-dielectric layer, the layer 17 could be deposited.

The particular examples described above are n-channel devices, in which the regions 13 and 14 are of n-type conductivity, the regions 15 and 35 are of p-type, and an electron inversion channel 12 is induced in the region 15 by the gate 11. By using opposite conductivity type dopants, a p-channel device can be manufactured by a method in accordance with the invention. In this case, the regions 13 and 14 are of p-type conductivity, the regions 15 and 35 are of n-type, and a hole inversion channel 12 is induced in the region 15 by the gate 11.

Semiconductor materials other than silicon may be used for devices in accordance with the invention, for example silicon carbide.

From reading the present disclosure, other variations and modifications will be apparent to persons skilled in the art. Such variations and modifications may involve equivalent and other features which are already known in the art and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

Thus, regardless of how the channel-accommodating region 15 is provided, there is provided a novel method (illustrated in FIGS. 22 to 24) of manufacturing an insulated trench-gate semiconductor device, wherein:
(a) a narrow window is defined by providing sidewall extensions at the sidewalls of a wider window in a first mask at a surface of a semiconductor body,
(b) a trench is etched into the body at the narrow window,
(c) the trench is lined with insulating material on which the gate is subsequently provided in the trench,
(d) a source region is provided so as to be self-aligned with the trench-gate by means of the sidewall extensions, and
wherein stage (c) comprises using the following sequence of steps to provide, under the gate, a first insulating material which is thicker than that provided for a gate-dielectric at the sidewalls of the trench:
depositing the first insulating material to a thickness that is sufficient to fill the trench and to extend above the trench and over the sidewall extensions and over the first mask,
etching back the first insulating material to leave it at the bottom of the trench, which etching back process also removes the sidewall extensions to re-expose the wider window in the first mask part,
providing a thinner gate-dielectric layer at the sidewalls of the trench,
depositing gate material to fill the wider window and the insulated trench therein, and
then etching back the gate material to be left as the gate over the first insulating material and adjacent to the gate-dielectric layer.

That which is claimed is:

1. A method of manufacturing a trench-gate semiconductor device having a trench-gate in a trench that extends from a source region of a first conductivity type through a channel-accommodating region of a second conductivity type to a drain region of the first conductivity type, wherein:
   (a) a narrow window is defined by providing sidewall extensions at the sidewalls of a wider window in a first mask at a surface of a semiconductor body,
   (b) a trench is etched into the body at the narrow window, and the gate is provided in the trench,
   (c) the source region is provided so as to adjoin a sidewall of the trench, and
   (d) the channel-accommodating region is provided using the following sequence of steps:
      removing the sidewall extensions to leave at least a part of the first mask at the surface of the body and to form a doping window between the first mask part and the trench-gate, and
      introducing dopant of the second conductivity type into the body at least via the doping window so as to form the channel-accommodating region adjacent to the sidewall of the trench and extending laterally below the first mask part.

2. A method according to claim 1, wherein the channel-accommodating region is formed by ion implantation of the dopant of the second conductivity type in stage (d) at a sufficiently high energy and in a sufficiently high dose that the dopant ions implanted at the doping window are scattered laterally below the first mask part.

3. A method according to claim 2, wherein the energy is sufficiently high that the dopant ions penetrate through the first mask part so as to be implanted in an underlying portion of the body into which the dopant ions implanted at the doping window are laterally scattered.

4. A method according to claim 2, wherein the dopant ions are of boron having an implantation energy in excess of 200 keV.

5. A method according to claim 3, wherein the first mask in stage (a) is a composite comprising an upper layer part on a lower layer part, the upper layer part is of a different material to the lower layer part so as to etchable from the lower layer part, and the upper layer part is etched away from the lower layer part before implanting the dopant ions through the lower layer part in stage (d).

6. A method according to claim 5, wherein the upper layer part is of silicon dioxide, and the lower layer part is of silicon nitride.

7. A method according to claim 2, wherein the energy and dose of the implanted dopant ions are sufficiently high that the dopant ions implanted at the doping window are scattered laterally by at least 0.4 micrometers below the first mask part.

8. A method according to claim 1, wherein the first mask and its associated windows have a layout geometry that defines device cells with a respective width to the first mask that is sufficiently small to allow the dopant introduced via the doping windows of the cell in stage (d) to merge into a substantially uniform doping profile below the first mask.

9. A method according to claim 1, wherein the first mask and its associated windows have a layout geometry that defines device cells with a pitch of about 1 micrometer or less.

10. A method according to claim 1, wherein the gate is provided in the trench before removing the sidewall extensions to define the doping window.

11. A method according to claim 1, wherein, after etching the trench, the sidewall extensions are removed to re-expose the wider window containing the doping window, and then gate material is deposited to fill the wider window and the trench therein and is etched back to be left as the gate in the trench.

12. A method according to claim 11, wherein, before removing the sidewall extensions, insulating material is deposited to a sufficient thickness to fill the trench and to extend above the trench and over the sidewall extensions and over the first mask, and the sidewall extensions are then removed in an etching step that etches back the insulating material until it is left in only a lower part of the trench, after which the gate is provided in a part of the trench above the insulating material in the lower part.

13. A method according to claim 1, wherein, after providing the channel-accommodating region in stage (d), an insulating overlayer is provided over the trench-gate in the wider window of the first mask part, the first mask part is then removed to form a contact window in the insulating overlayer, and a source electrode is deposited to contact the source region at the contact window and to extend over the insulating overlayer over the trench-gate.

14. A method as claimed in claim 13, wherein the insulating overlayer is provided by depositing insulating material to a thickness that is sufficient to fill the wider window and to extend above the wider window and on the first mask part, and then etching back the insulating material to leave the insulating material over the trench-gate and in the doping window.

15. A method according to claim 14, wherein the gate is provided in a part of the trench below the level of the surface of the body, and the subsequently deposited and etched-back insulating material is left in the upper part of the trench and extends laterally from the trench into the doping window.

16. A method according to claim 1, wherein the gate is provided in a part of the trench below the level of the surface of the body, insulating material is deposited in an upper part of the trench to form an insulating overlayer over the gate, the first mask part is removed after stage (d) to form a contact window that includes the doping window, and a source electrode is deposited to contact the source region at the contact window and to extend over the insulating overlayer over the trench-gate.

17. A method according to claim 13, wherein, after forming the contact window, dopant of the second conductivity type is introduced into the body via the contact window so as to form a more highly doped contact region for the channel-accommodating region, and then the source electrode is deposited to contact both the source region and the contact region at the contact window.

18. A method according to claim 1, wherein the trench is etched in stage (b) through a silicon body portion having a doping concentration of the first conductivity type that extends from the surface into an underlying area to provide a part of the drain region.

19. A method according to claim 18, wherein a gate dielectric layer is formed by thermal oxidation of the silicon body portion at the walls of the trench.

20. A method according to claim 1, wherein the sequence of stages (b) and (c) are such that the source region has a doping concentration of the first conductivity type that is provided in the body after providing the gate in the trench in stage (b).

21. A method according to claim 1, wherein the source region is provided in step (b) in such a way as to be self-aligned with the trench-gate by means of the sidewall extensions.

22. A method according to claim 21, wherein the doping concentration of the first conductivity type of the source region is introduced into the body via the doping window between the first mask part and the trench-gate.

23. A method according to claim 1, wherein stage (d) for providing the channel-accommodating region is carried out before providing an insulating overlayer over the gate, and wherein the gate comprises semiconductor material having a doping concentration of the first conductivity type that is of greater magnitude than the doping concentration of the second conductivity type introduced in stage (d) for the channel-accommodating region.

24. A method according to claim 1, wherein the first mask comprises a thick layer of silicon nitride on a thin layer of silicon dioxide on the semiconductor body surface, and wherein the sidewall extensions are of silicon dioxide.

* * * * *